(12) United States Patent
Chen

(10) Patent No.: US 7,982,498 B1
(45) Date of Patent: Jul. 19, 2011

(54) SYSTEM AND METHOD FOR POWER DOMAIN ISOLATION

(75) Inventor: Shi-Hao Chen, Nantou (TW)

(73) Assignee: Global Unichip Corp., Hsin-Chu (TW)

( * ) Notice: Subject to any disclaimer, the term of this patent is extended or adjusted under 35 U.S.C. 154(b) by 0 days.

(21) Appl. No.: 12/782,372

(22) Filed: May 18, 2010

(51) Int. Cl.
*H03K 19/0175* (2006.01)
(52) U.S. Cl. .............................. 326/80; 326/63; 326/21
(58) Field of Classification Search .............. 326/21, 326/26, 27, 80–87, 68–71
See application file for complete search history.

(56) References Cited

U.S. PATENT DOCUMENTS
7,251,740 B2 * 7/2007 Newman ..................... 713/401

OTHER PUBLICATIONS

Chattopadhyay, A., et al., "Automatic ADL-based Operand Isolation for Embedded Processors," Proceedings of the Design Automation and Test in Europe Conference, Mar. 10, 2006, 6 pages, vol. 1.
Zhang, G., et al., "Low Power Techniques on a High Speed Floating-point Adder Design," Proceedings of the 2007 IEEE Inernational Conference on Integration Technology, Mar. 20-24, 2007, pp. 241-244. Shenzhen, China.

* cited by examiner

*Primary Examiner* — Don P Le
(74) *Attorney, Agent, or Firm* — Slater & Matsil, L.L.P.

(57) ABSTRACT

In one embodiment, a power domain isolation interface is disclosed. The interface has a level shifter having a signal input coupled to a first power domain and a memory element. The memory element has a signal input coupled to an output of the level shifter, an output coupled to a second power domain, and a hold enable input, wherein the memory element is configured to hold an input state when the hold enable input becomes asserted.

20 Claims, 4 Drawing Sheets

SYSTEM AND METHOD FOR POWER DOMAIN ISOLATION

TECHNICAL FIELD

This invention relates generally to semiconductor circuits, and more particularly to a system and method for isolation between power domains.

BACKGROUND

Maintaining low power consumption in portable electronic devices such as mobile phones, MP3 players and digital cameras becomes more challenging as these devices achieve higher levels of functionality. An increase in processing power and speed for these devices often requires a corresponding increase in the number of circuit devices, an increase in clock frequencies at which these circuit devices operate, and an increase in overall power consumed by these circuits.

A few techniques have been used to manage power consumption of integrated circuits (ICs). Multiple supply voltages (MSV) are used to power different sections of the IC based on their power requirements. For example, a section of the IC that performs computation can be powered at a lower supply voltage than a section of the IC devoted to an input-output (I/O) interface. Dynamic voltage scaling (DVS) is used to vary the supply voltage of sections of the IC based on a mode of operation, can also be used. For example, a memory component may be operated at a higher supply voltage during a write operation then during a read operation. Furthermore, clock gating (CG) is used to disable unused sections of an integrated circuit by disabling a local clock signal. For example, sections of a digital camera chipset responsible for data compression can be disabled during times when picture compression is not being performed by disabling a clock signal to the data compression circuits. By eliminating logic transitions, dynamic power consumption due to the charging and discharging of internal node capacitance is reduced.

Because of shrinking device geometries, and their corresponding increase in circuit density, static leakage current has become a more dominant factor in power consumption. Consequently, a circuit or logic block that has been shut down only by clock gating has the potential to still consume an appreciable amount of power due to static leakage current. One solution to the problem of static leakage current is to disable the power supply of the unused block. One difficulty with shutting down a power supply to a circuit is maintaining an interface logic on the boundary between a section of the IC that has a disabled power supply and another section of the IC that has an enabled power supply. Logic that bridges such a boundary can be subject to difficulties which include indeterminate states due to floating nodes, leakage current in interface devices between the two power domains, and lack of retention of logic states within disabled blocks.

What is needed are power efficient systems and methods of interfacing between power domains.

SUMMARY OF THE INVENTION

In one embodiment, a power domain isolation interface is disclosed. The interface has a level shifter having a signal input coupled to a first power domain and a memory element. The memory element has a signal input coupled to an output of the level shifter, an output coupled to a second power domain, and a hold enable input, wherein the memory element is configured to hold an input state when the hold enable input becomes asserted.

In another embodiment, a semiconductor circuit is disclosed. The semiconductor circuit has a first power domain, a second power domain, and a power domain interface. The power domain interface has a level shifter that includes an input coupled to the first power domain, and a latch having an input coupled to an output of the level shifter, an output coupled to the second power domain, and a hold input.

In a further embodiment, a method of operating a interface coupled between a first and a second power domain is disclosed. The method includes placing the interface into a sleep mode and transitioning the interface out of the sleep mode. Placing the interface into the sleep mode includes asserting a hold signal coupled to a latch that include an output coupled to a second power domain, and after asserting the hold signal, asserting a disable signal coupled to a level shifter coupled between the first power domain and the latch. Transitioning the interface out of the sleep mode includes de-asserting the disable signal, and after de-asserting the disable signal, de-asserting the hold signal.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely an interface circuit for interfacing and isolating power domains on an IC. Embodiments of this invention may also be applied to other circuits and systems use multiple power supplies and/or multiple supply zones.

Figure 1:
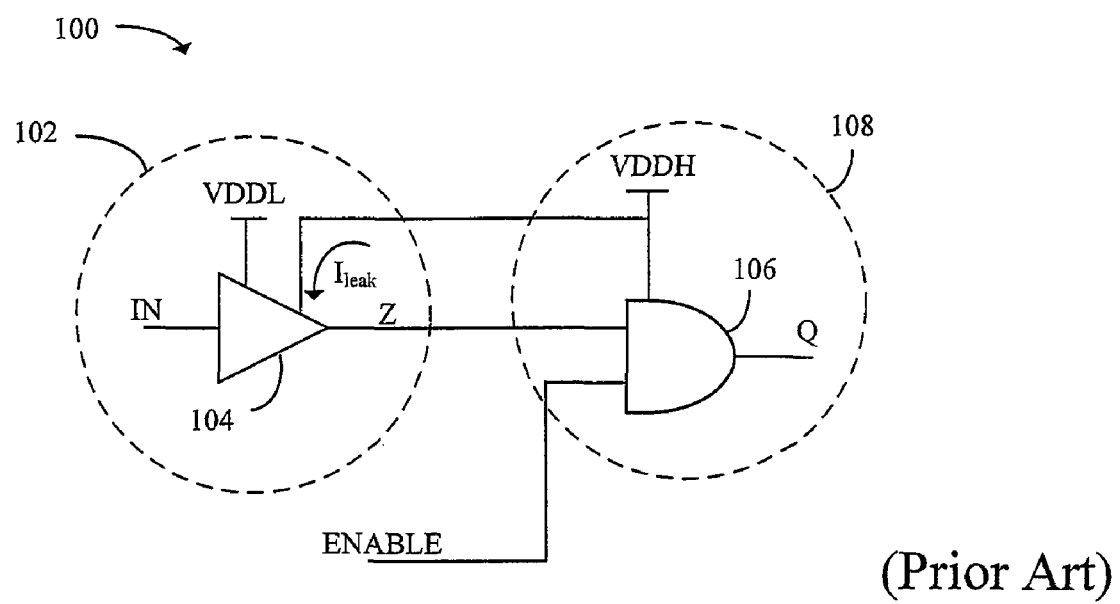
FIG. 1 illustrates a power domain interface according to the prior art.

A prior art power domain interface 100 circuit is shown in FIG. 1. Interface circuit 100 includes level shifter 104 and isolation cell 106. Level shifter 104 translates logic signal IN from first power domain 102 to signal Z, which is referenced according to second power domain 108. Logic within first domain 102 is referenced to low voltage supply VDDL, while logic within second domain 108 is referenced to high voltage supply VDDH.

When power gating (PG) techniques are used to shut down first power domain 102, supply VDDL is typically disconnected from the first power domain, either by grounding VDDL or by disconnecting or open circuiting the VDDL supply line. When first power domain 102 is disabled, internal nodes within power domain 102 may attain an indeterminate state. Isolation cell 106, therefore, has an ENABLE input that prevents an indeterminate value at output Z of level shifter 104 from propagating through to second power domain 108.

Prior art power domain interface 100 suffers from at least two disadvantages. First, internal states within first power domain 102 are lost when first power domain 102 is disabled. Second, static leakage occurs at least within the output stage of level shifter 104. This leakage occurs because high voltage supply VDDH continues to be applied to level shifter 104 even when first power domain 102 is disabled. Static leakage current occurs as a result of VDDH being applied to devices internal to level shifter 104. Such static leakage can also be seriously exacerbated if nodes internal to level shifter 104 are floating.

Figure 2:
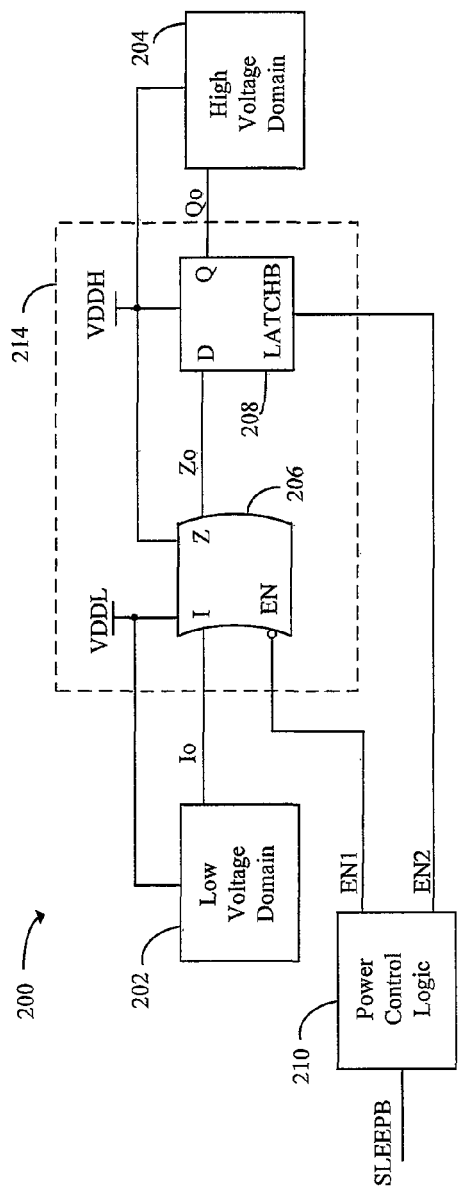
FIG. 2 illustrates a schematic of an embodiment of a power domain isolation interface circuit.

A power domain isolation interface system 200 according to an embodiment of the present invention is illustrated in FIG. 2. System 200 has power domain isolation interface 214, which interfaces between low voltage domain 202 and high voltage domain 204. In a typical embodiment, a low voltage domain is used for logic circuitry and has a nominal power supply voltage of between about 0.9V and about 1.2V. Low voltage domain 202 can be enabled or disabled depending on whether or not the circuits within low voltage domain 202 are needed by the rest of the system. High voltage domain 204, on the other hand has a nominal voltage supply of between about 1.0 V and about 1.2 V. In some embodiments of the present invention, these nominal voltage supply ranges are configurable. If high voltage domain 204 is an I/O block, high voltage domain 204 typically stays powered up while low voltage domain 202 is powered down or disabled. It should be noted that the designation of power domains 202 and 204 as a low voltage domain and a high voltage domain respectively is given as an example. In alternative embodiments of the present invention, both domains 202 and 204 may operate that the same power supply voltage, or domain 202 can operate at a higher power supply voltage than domain 204.

Power domain isolation interface 214 has level shifting circuit 206 and latch 208. Latch 208 is preferably a transparent latch designed according to conventional circuit design techniques known in the art. In the embodiment of FIG. 200, latch 208 has input signal D, output signal Q and active low latch input LATCHB. When input LATCHB goes high, the input at D is propagated to the output at Q. When input LATCHB goes low, however, latch 208 holds the output at Q until LATCHB goes high again. In alternative embodiments of the present invention, the polarity of the inputs and outputs of latch 208 can be different. For example, input LATCHB, could be configured to latch the output when high, or signals D and Q could be configured to be active low. Furthermore, latch 208 can be implemented with other elements that store states, such as a flip-flop or other memory element.

Level shifter 206 is configured to translate logic input signal I, which is referenced to VDDL, to logic output signal Z, which is referenced to VDDH. Enable signal EN clamps the output of level shifter 206 to constant (logic high) when signal EN1 is low. Level shifter 206 becomes transparent (input I is propagated to output Z) when EN is high. In alternative embodiments of the present invention, the polarities of I, Z and EN may differ from the embodiment shown in FIG. 2.

Power control logic 210 generates enable signals EN1 and EN2 based on input SLEEPB, which control the operation of power domain isolation interface 214. When SLEEPB goes low, power domain isolation interface 214 stores the last state and disables level shifter 206, preferably by clamping output Zo to a reference or supply voltage such as VDDL. Alternatively, Zo can assume a high impedance state. In preferred embodiments of the present invention, signal Zo is latched by latch 208 prior to the disabling (and output clamping) of level shifter 206. This way, a valid state of signal Zo based on signal Io can be saved while low voltage domain 202 is disabled. Once latch 208 has been latched, level shifter 206 can be disabled and/or clamped. Alternatively, node Zo can float, if necessary without causing appreciable leakage current.

Figure 3:
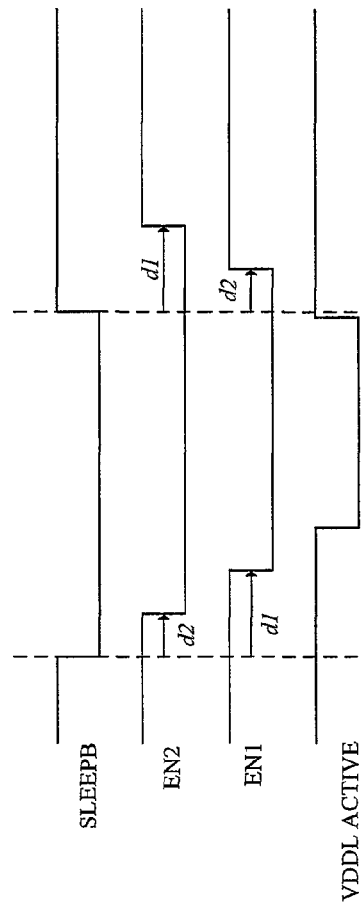
FIG. 3 illustrates a timing diagram of an embodiment of a power domain isolation interface.

FIG. 3 illustrates timing relationship between signals SLEEPB, EN1 and EN2 according to a preferred embodiment. When Signal SLEEPB transitions low, signal EN2 transitions low after delay d2, and signal EN1 transitions low after a delay of d1, where d1 is preferably longer than d2. By making d1 longer than d2, the value of latch 208 (FIG. 2) is held before the output Zo of level shifter 206 becomes invalid. When EN1 goes low, level shifter 206 (FIG. 2) becomes disabled (i.e., the output is clamped to a constant voltage), so its output state at Zo may not have the same value as before level shifter 206 becomes disabled.

Signal VDDL_ACTIVE designates whether low voltage domain 202 is active. In preferred embodiments of the present invention, low voltage domain 202 is disabled at least after the state of latch 208 is held via signal EN2. Low voltage domain 202 is disabled by using a PMOS header switch (PMOS) to open the power net or a NMOS footer switch to open the ground net, however, other power domain shutdown techniques can be used in alternative embodiments. By holding the state of the latch prior to shutting down the low voltage power domain, the state of low voltage domain output Io can be reliably held. In alternative embodiments, low voltage domain 202 can be shutdown at other times relative to the activation of power domain interface circuit 214.

When the low voltage domain is powered up, on the other hand, signal SLEEPB is brought high, and signal EN1 is brought high at a time delay d2 after SLEEPB goes high, which powers up level shifter 206. Likewise, signal EN2 is brought high at a time delay d1 after SLEEPB goes high, wherein d1 preferably has a longer delay than d2. Signal VDDL_ACTIVE preferably activates low voltage domain 202 before signal EN2 makes latch 208 transparent to avoid glitching at output Qo of latch 208.

Figure 4:
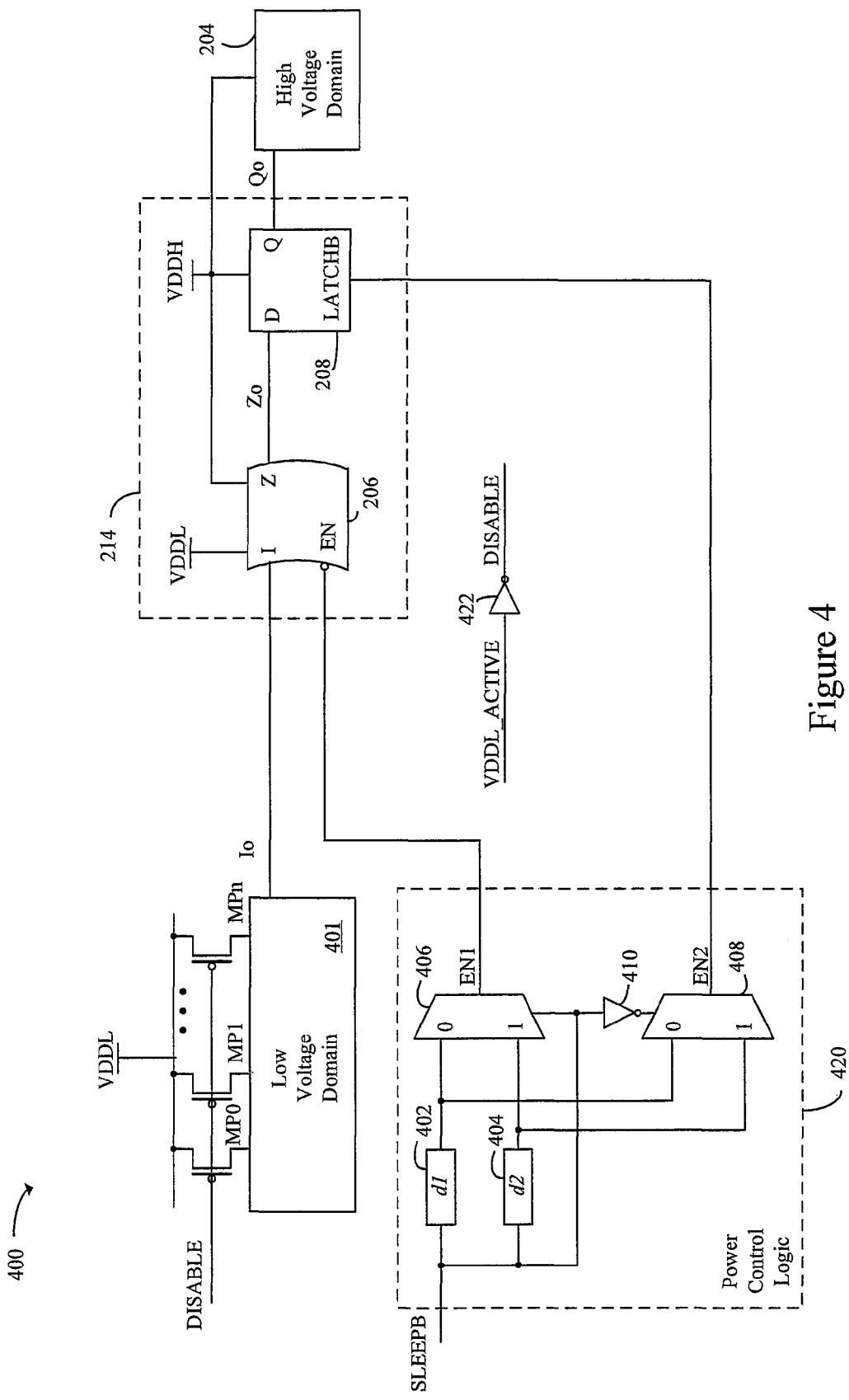
FIG. 4 illustrates a schematic of a power domain isolation interface circuit according to a further embodiment.

FIG. 4 illustrates power interface and isolation system 400 according to another embodiment of the present invention. Like the embodiment in FIG. 2, system 400 has power interface and isolation circuit 214 having level shifter 206 and latch 208 to couple between low voltage domain 401 and high voltage domain 204. In the present embodiment, PMOS transistors MP0 to MPn are coupled between circuits within low voltage domain 401 and low voltage power supply VDDL. The gates of transistors MP0 to MPn are coupled to active high signal, DISABLE, which is coupled to signal VDDL_ACTIVE via inverter 422. In alternative embodiments of the present invention, other circuits techniques besides using PMOS switches MP0 to MPn. For example, NMOS transistors, can be used.

Power control logic 420 has delay elements 402 and 404 coupled between input signal SLEEPB and multiplexers 406 and 408. Delay element 402 has a time delay of d1, and delay element 404 has a time delay of d2, where the time delay of d1 is preferably greater than the time delay of d2. In preferred embodiments of the present invention, time delay d1 is can be between about one to two clock cycles and time delay d2 can be between about two to three clock cycles. This time delay is preferably configurable depending on the system clock. In alternative embodiments of the present invention, other time delays may be used. These time delays are preferably generated by a finite state machine, however, in alternative embodiments of the present invention, other delay generation techniques can be used, for example asynchronous gate delays, inverter chains, delay lines, etc.

Inverter 410 is coupled between signal SLEEPB and the select input of multiplexer 408. Power control logic 420 implements the waveform diagram of FIG. 3 in embodiments of the present invention. Alternatively, other implementations of power control logic can be used, for example, signals EN1 and EN2 can be generated using synchronous logic rather than asynchronous logic, or other logic design techniques known in the art.

Figure 5:
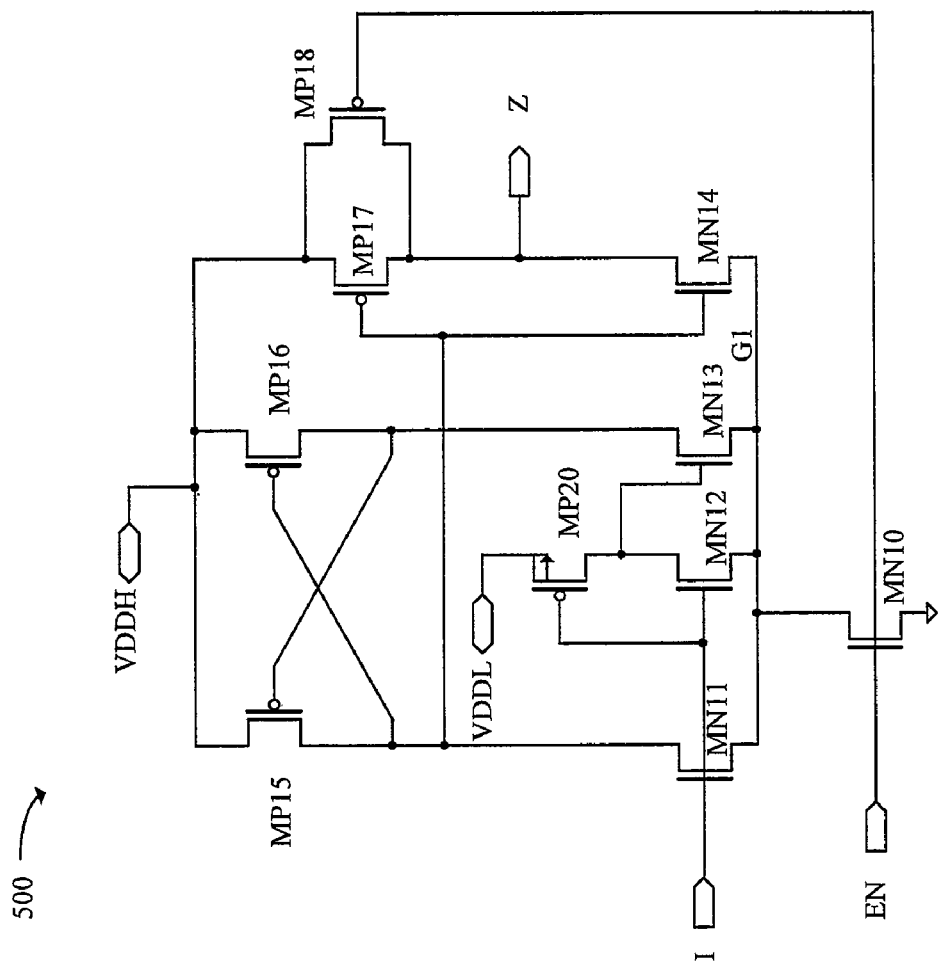
FIG. 5 illustrates a schematic of an embodiment of a level shifter circuit.

FIG. 5 illustrates level shifter 500 according to an embodiment of the present invention. Level shifter 500 has a level shifter circuit coupled between VDDH and node G1, and between VDDL and node G1. Node G1 is coupled to ground via NMOS switch transistor MN10. Likewise, output node Z is coupled When signal EN is high, transistor MN10 couples node G1 to ground, thereby enabling the operation of the level shifter. When signal EN is low, however, PMOS switch transistor MP18, which couples output Z to VDDH, turns on, thereby pulling output Z high and ensuring output Z attains a known state while level shifter 500 is disabled. In preferred embodiments, signal EN is referenced to VDDH.

Level shifter 500 also has a cross-coupled PMOS transistor pair made of MP15 and MP16. The drain of MP15 is coupled to NMOS input transistor MN11, and the drain of MP16 is coupled to NMOS transistor MN13. Logic input signal I is coupled to the gate of input transistor MN11, while an inverted version of logic input signal I is applied to transistor MN13 via a VDDL referenced inverter made of transistors MN12 and MP20. This inverter is referenced to low voltage VDDL. Consequently, the source of MP20 is connected to its drain as shown in FIG. 5. An inverter made of transistors MN14 and MP17 buffer the logic signal at the drains of MP15 and MN11 to output Z. When MN10 is off, transistor MN14 within the output stage of level shifter 500 attain a high impedance state, thereby reducing leakage. In alternative embodiments of the present invention, level shifter 500 can be implemented using other level shifting circuits known in the art.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A power domain isolation interface comprising:
   a level shifter comprising a signal input coupled to a first power domain, and a disable input, wherein the level shifter is configured to be in a low leakage state when the disable input is asserted; and
   a memory element comprising
      a signal input coupled to an output of the level shifter,
      an output coupled to a second power domain, and
      a hold enable input, wherein the memory element is configured to hold an input state when the hold enable input becomes asserted.

2. The power domain interface of claim 1, wherein the memory element comprises a transparent latch.

3. The power domain interface of claim 1, wherein the second power domain comprises a higher supply voltage than the first power domain.

4. The power domain interface of claim 1, wherein the power domain interface is disposed on a semiconductor circuit.

5. The power domain interface of claim 1, further comprising a controller, the controller comprising:
   a hold enable output coupled to the hold enable input of the memory element; and
   a disable output coupled to the disable input of the level shifter, wherein the controller is configured to
      assert the hold enable output and assert the disable output when the power domain interface transitions into a sleep mode, and
      de-assert the hold enable output and de-assert the disable output when the power domain interface transitions out of the sleep mode.

6. The power domain interface of claim 5, wherein
   the controller further comprises a sleep mode input; and
   the controller is further configured to
      assert the disable output a first delay time after asserting the hold enable output when the power domain interface transitions into the sleep mode,
      and de-assert the disable output a second delay time before de-asserting the hold enable output when the power domain interface transitions out of the sleep mode.

7. The power domain interface of claim 6, wherein the controller is further configured to disable the first power domain.

8. The power domain interface of claim 1, wherein the hold enable input and the disable input comprise active low signals.

9. A semiconductor circuit comprising:
   a first power domain;
   a second power domain; and
   a power domain interface comprising
      a level shifter comprising an input coupled to the first power domain, and a disable input, wherein the level shifter is configured to attain a low leakage state when the disable input is asserted, and
      a latch comprising
         an input coupled to an output of the level shifter,
         an output coupled to the second power domain, and
         a hold input.

10. The semiconductor circuit of claim 9, wherein the level shifter further comprises a series switch coupled between a level shifter core circuit and a power supply input, wherein an impedance of the switch comprises a first impedance when the disable input is asserted and a second impedance when the disable input is not asserted, and the first impedance is greater than the second impedance.

11. The semiconductor circuit of claim 10, wherein the switch comprises a MOS transistor.

12. The semiconductor circuit of claim 10, wherein the level shifter core comprises a cross coupled pair of MOS devices.

13. The semiconductor circuit of claim 12, wherein the level shifter core further comprises a shunt switch coupled between the output of the level shifter and a reference voltage.

14. The semiconductor circuit of claim 13, wherein the reference voltage comprises a second power domain supply voltage.

15. The semiconductor circuit of claim 10, further comprising a controller coupled to the hold input of the latch and the disable input of the level shifter.

16. The semiconductor circuit of claim 15, wherein the controller comprises:

a sleep input;

a first delay element comprising an input coupled to the sleep input and an output coupled to a first input of a first multiplexer and a first input of a second multiplexer; and a second delay element comprising an input coupled to the sleep input and an output coupled to a second input of the first multiplexer and a second input of the second multiplexer, wherein the sleep input is coupled to a select port of the first-multiplexer, an inversion of the sleep input is coupled to a select port of the second multiplexer.

17. A method of operating an interface coupled between a first and a second power domain, the method comprising placing the interface into a sleep mode, placing comprising asserting a hold signal coupled to a latch comprising an output coupled to the second power domain, and after asserting the hold signal, asserting a disable signal coupled to a level shifter coupled between the first power domain and the latch; and transitioning the interface out of the sleep mode, transitioning comprising de-asserting the disable signal, and after de-asserting the disable signal, de-asserting the hold signal.

18. The method of claim 17, wherein:

placing the interface into the sleep mode further comprises asserting the disable signal a first time delay after asserting the hold signal; and transitioning the interface out of the sleep mode further comprises de-asserting the hold signal a second time delay after de-asserting the disable signal.

19. The method of claim 17, further comprising disabling the first power domain while the interface is in the sleep mode.

20. The method of claim 19, wherein disabling comprises shutting off a series switch coupled between a first power domain power supply and circuitry within the first power domain.

\* \* \* \* \*